(12) United States Patent
Kariya

(10) Patent No.: US 6,177,711 B1
(45) Date of Patent: Jan. 23, 2001

(54) PHOTOELECTRIC CONVERSION ELEMENT

(75) Inventor: Toshimitsu Kariya, Nara (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 08/931,745

(22) Filed: Sep. 16, 1997

(30) Foreign Application Priority Data

Sep. 19, 1996 (JP) .................................................. 8-247838

(51) Int. Cl.$^7$ .................................................. H01L 29/72
(52) U.S. Cl. ............................ 257/458; 257/64; 257/436
(58) Field of Search ................................. 257/458, 436, 257/64

(56) References Cited

U.S. PATENT DOCUMENTS

| | | | |
|---|---|---|---|
| 5,221,365 | * 6/1993 | Noguchi et al. ...................... | 136/258 |
| 5,282,902 | * 2/1994 | Matsuyama ........................... | 136/249 |
| 5,453,135 | * 9/1995 | Nakagawa et al. .................... | 136/259 |
| 5,486,237 | * 1/1996 | Sano et al. ............................. | 136/258 |
| 5,510,285 | 4/1996 | Kim ........................................ | 437/53 |
| 5,549,763 | * 8/1996 | Sano et al. ............................. | 136/255 |
| 5,585,653 | 12/1996 | Nakashiba ............................. | 257/232 |
| 5,677,236 | * 10/1997 | Saitoh et al. .......................... | 437/109 |

FOREIGN PATENT DOCUMENTS 0 729 190    8/1996    (EP) .

OTHER PUBLICATIONS

Meier, J., et al., "Intrinsic Microcrystalline Silicon (uc–Si:H)–A Promising New Thin Film Solar Cell Material", 1994 IEEE First World Conference on Photovoltaic Energy Conversion, vol. 1, p. 409 (1994).

M.B. Schubert et al., "Optimum Front Contact and Growth Conditions for Microcrystalline Silicon Solar Cells from Hot–Wire CVD", 25$^{th}$ IEEE Photovoltaic Spec. Conf. Proc., pp. 1081–1084 (May 1996).

Patent Abstracts of Japan, E–1578, Apr. 15, 1994, p.7 (corresponds to JP 6–104476).

Patent Abstracts of Japan, E–511, Jan. 8, 1987, p.78 (corresponds to JP 62–2575).

Patent Abstracts of Japan, E–893, Dec. 7, 1989, p.141 (corresponds to JP 1–303752).

Patent Abstracts of Japan, E–430, Apr. 17, 1986, p. 155 (corresponds to JP 61–75559).

* cited by examiner

*Primary Examiner*—Edward Wojciechowicz
(74) *Attorney, Agent, or Firm*—Fitzpatrick, Cella, Harper & Scinto

(57) ABSTRACT

A photoelectric conversion element has a substrate, a lower conductive layer, a first doped layer, an i-layer, a second doped layer, and an upper conductive layer, wherein a surface of the lower conductive layer has an uneven configuration, the i-layer contains prismatic crystalline grains, and longitudinal directions of the prismatic crystalline grains are inclined with respect to a direction of a normal line to the substrate. A percentage of an overall volume of prismatic crystalline grains, each having an angle, defined below, of 20° or less, is 70% or more with respect to an overall volume of the i-layer; the angle is defined as an angle between a straight line passing a prismatic crystalline grain and being parallel to the longitudinal direction thereof and a straight line passing the prismatic crystalline grain out of straight lines taking shortest courses between the interface between the first doped layer and the i-layer and the interface between the second doped layer and the i-layer. The photoelectric conversion element of the present invention is improved in characteristics including photoelectric conversion efficiency, open-circuit voltage, short-circuit photocurrent, low-illuminance open-circuit voltage, and leak current. In addition, durability and upon are enhanced in an outdoor exposure test and long-term irradiation of light. Further, the cost of the further electric conversion element can be decreased greatly.

12 Claims, 11 Drawing Sheets

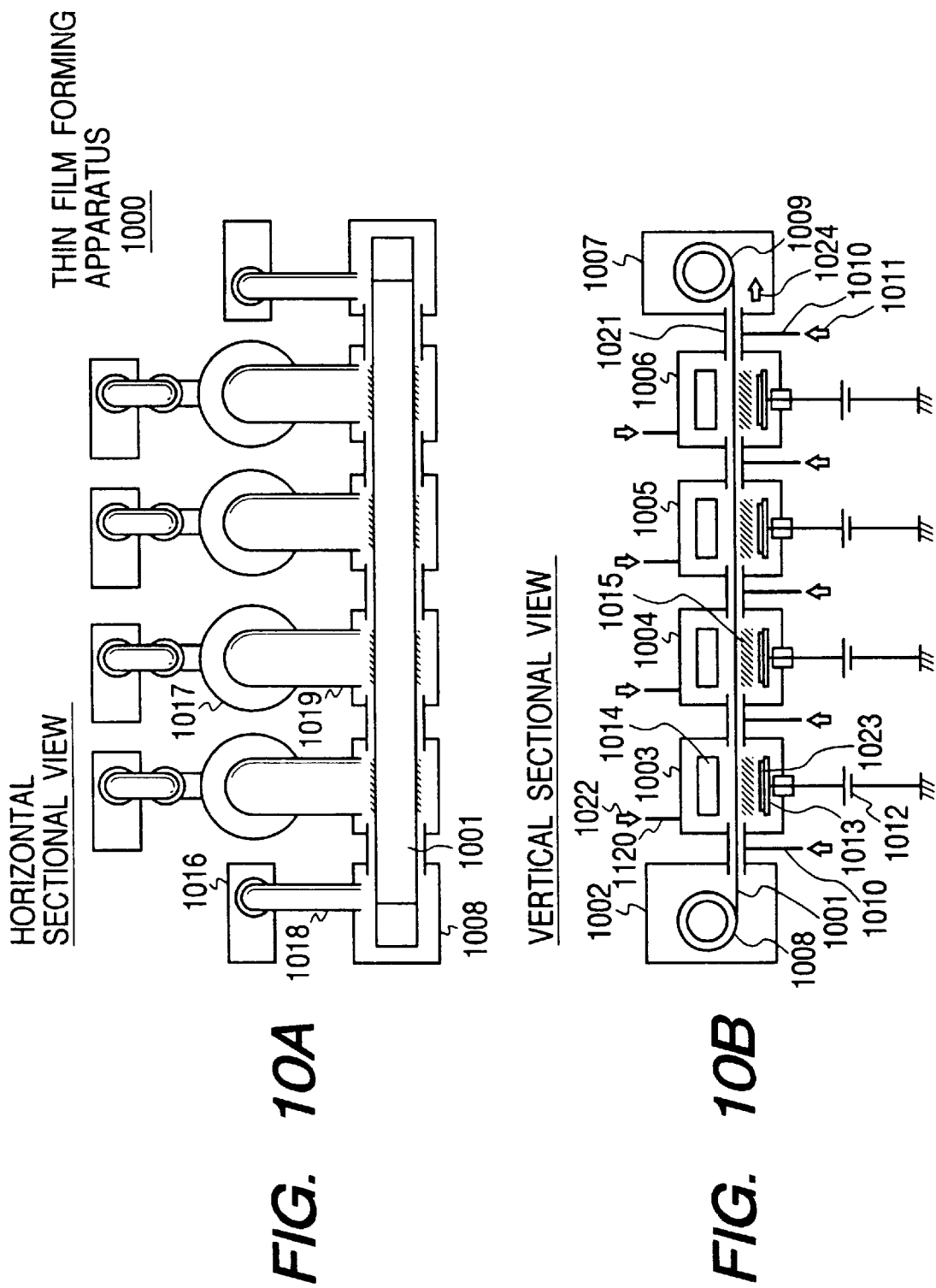

PERCENTAGE K(%) OF ANGLE F
IN RANGE 0—20 DEGREE

PHOTOELECTRIC CONVERSION ELEMENT

BACKGROUND OF THE INVENTION

1. Field of the Invention

The present invention relates to a nonmonocrystalline photoelectric conversion element having an improved lower conductive layer surface configuration, i-layer crystal structure, and doped layer structure.

2. Related Background Art

Increase in photoelectric conversion efficiency and improvement in optical degradation have been studied heretofore for the photoelectric conversion elements incorporating the pin junction of a nonmonocrystalline semiconductor.

It is known that increasing a concentration of dopant in a doped layer decreases activation energy of the doped layer, thereby increasing the built-in potential of the pin junction and the open-circuit voltage of the element.

It is also known that use of a microcrystalline material for the i-type semiconductor layer improves optical degradation.

It is reported that a solar cell using microcrystalline silicon ($\mu$ c-Si) achieved a photoelectric conversion efficiency of 4.6% using plasma enhanced CVD using VHF (70 MHz) and that the solar cell demonstrated no optical degradation at all, as seen in J. Meier, A. Shah, "INTRINSIC MICROCRYSTALLINE ($\mu$ c-Si:H)-A PROMISING NEW THIN FILM SOLAR CELL MATERIAL," IEEE WCPEC; 1994 Hawaii, p.409. Further, a stacked solar cell was fabricated by combining of amorphous silicon with microcrystalline silicon and achieved an initial photoelectric conversion efficiency of 9.1%.

It is also known that a transparent, conductive layer is interposed between the substrate or metal layer and the semiconductor layers. This prevents elements in the metal layer from diffusing or migrating into the semiconductor layers, thus preventing the photoelectric conversion element from shunting. Further, it has a moderate resistance and prevents the semiconductor layers from short-circuiting due to a defect such as a pinhole. In addition, the transparent, conductive layer is provided with an uneven surface, thereby increasing irregular reflection of incident light and reflected light to lengthen optical pathlengths in the semiconductor layers.

With the above-stated solar cell using the microcrystalline silicon based material, however, the photoelectric conversion efficiency thereof is still too low, 4.6%, to be of practical use.

With the stacked solar cell of a-Si/$\mu$ c-Si, the initial photoelectric conversion efficiency is as high as 9.1%, but it suffers from great optical degradation of the a-Si layer on the light incidence side. Further, the thickness of the $\mu$ c-Si layer is thick, 3.6 $\mu$m, and the rate of deposition is slow, 1.2 Å/sec. Thus, the time necessary for layer formation is approximately eight hours; this poses another problem in that the time for layer formation does not reach an industrially practical level.

SUMMARY OF THE INVENTION

An object of the present invention is to provide a photoelectric conversion element having a substrate, a lower conductive layer, a first doped layer, an ilayer, a second doped layer, and an upper conductive layer, wherein a surface of the lower conductive layer has an uneven configuration, the i-layer contains prismatic crystalline grains, and longitudinal directions of the prismatic crystalline grains are inclined with respect to a direction of a normal line to the substrate. According to an embodiment of the present invention, as a numerical definition, a percentage of an overall volume of prismatic crystalline grains, each having a below-defined angle of 20° or less, is 70% or more with respect to an overall volume of the i-layer; the angle is defined as an angle between a straight line A passing a prismatic crystalline grain and being parallel to a longitudinal direction thereof and a straight line B passing the prismatic crystalline grain A out of straight lines taking shortest courses between interface 1 between the first doped layer and the i-layer and interface 2 between the second doped layer and the i-layer.

Further, according to another embodiment, the photoelectric conversion element is characterized in that a third doped layer, a second i-layer, and a fourth doped layer are interposed between the second doped layer and the upper conductive layer, the second i-layer has an amorphous silicon based semiconductor, and a thickness of the second i-layer is in the range of 0.1 $\mu$m to 0.4 $\mu$m both inclusive.

According to the present invention, the photoelectric conversion element is characterized in that the first doped layer and/or the third doped layer is of a stacked structure comprising a layer of a microcrystalline silicon based semiconductor material and a layer of an amorphous silicon based semiconductor material and in that the layer of the microcrystalline silicon based semiconductor material is in contact with the i-layer.

The photoelectric conversion element of the present invention is improved in characteristics including photoelectric conversion efficiency, open-circuit voltage, short-circuit photocurrent, low-illuminance open-circuit voltage, and leak current of the photoelectric conversion element. In addition, durability of the element is enhanced in outdoor exposure tests, in mechanical strength tests, and upon long-term irradiation with light. Further, the cost of a photoelectric conversion element can be decreased greatly.

BRIEF DESCRIPTION OF THE DRAWINGS

FIG. 10 is a drawing to show an apparatus for continuously forming the lower conductive layer and upper transparent electrode of the photoelectric conversion element of the present invention;

DETAILED DESCRIPTION OF THE PREFERRED EMBODIMENTS

Figure 1A:
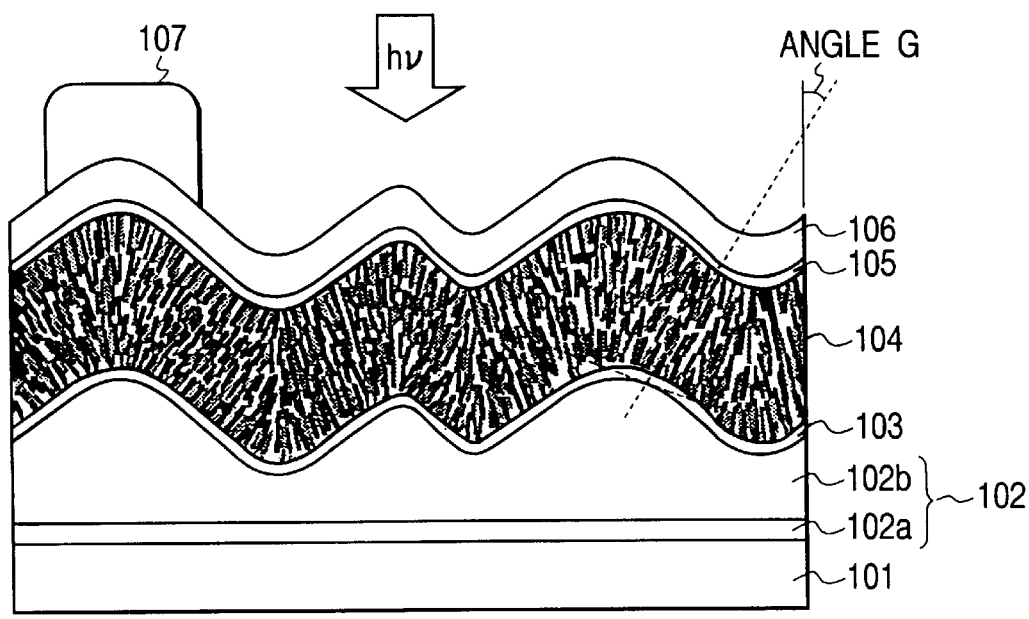
FIGS. 1A and 1B are drawings to show photoelectric conversion elements of the present invention featuring the lower conductive layer and the i-layer.

FIG. 1A is a schematic, cross-sectional view of the photoelectric conversion element of the present invention, wherein reference numeral 101 designates a substrate, 102 a lower conductive layer comprised of two layers, reflecting layer 102a and transparent, conductive layer 102b, 103 a first doped layer of a nonmonocrystalline silicon based semiconductor material, 104 a layer of a microcrystalline silicon based semiconductor material having the i-type conduction property, and 105 a layer of a nonmonocrystalline silicon based semiconductor material having the opposite conduction property to that of the first doped layer. The layer structure of 103-104-105 forms the p-i-n junction and generates photoelectromotive force. The layers 103, 104, 105 will be referred to together as a photovoltaic layer. Numeral 106 denotes an upper transparent electrode and 107 a collector electrode.

The lower conductive layer 102, i-layer 104, and first doped layer 103 of the present invention have the following features.

Figure 12A:
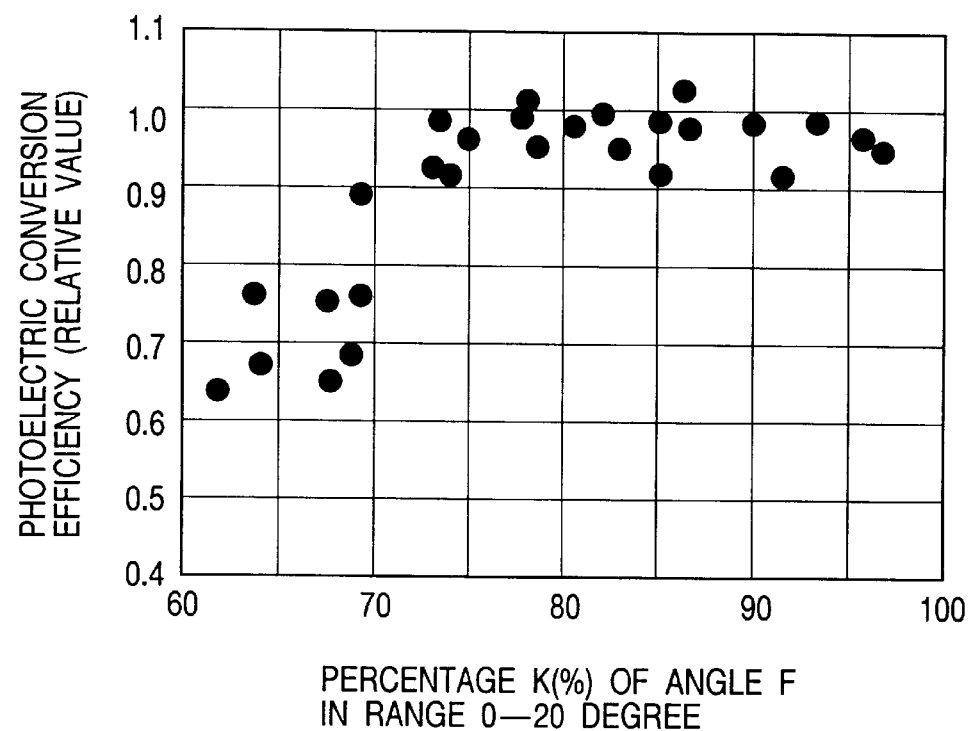
FIG. 12A is a drawing to show the relationship of photoelectric conversion efficiency with percentage of angle F defined in FIG. 12B in the range of 0° to 20° both inclusive.
Figure 12B:
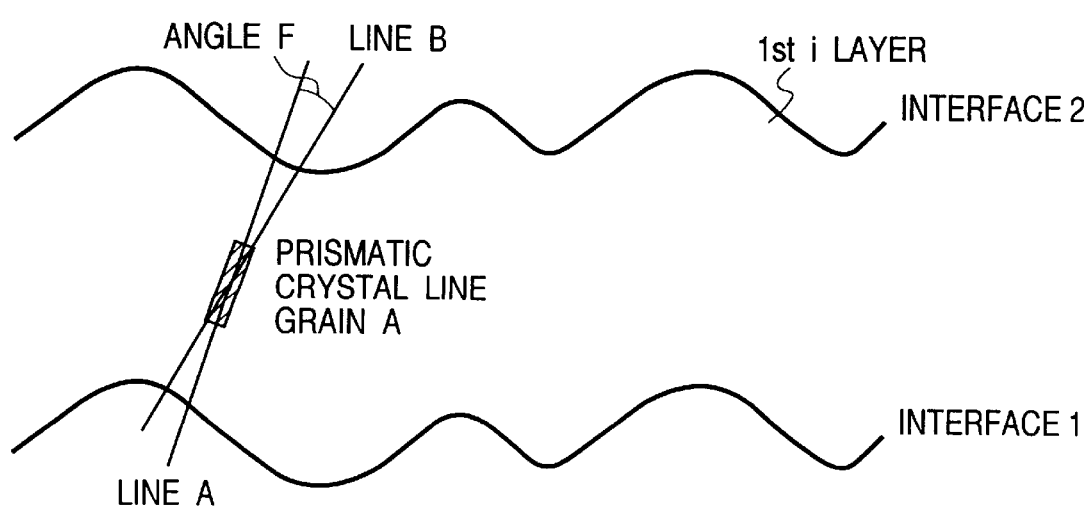
FIG. 12B is a drawing for defining angle F.

(1) The relationship of mechanical strength and photoelectric conversion efficiency to the direction of prismatic crystalline grain was checked. Frequency distribution of angle F between straight line A passing a certain prismatic crystalline grain A and being parallel to the longitudinal direction thereof and straight line B passing the prismatic crystalline grain A out of straight lines taking shortest courses between interface 1 between the first doped layer and the first i-layer and interface 2 between the second doped layer and the first i-layer, was checked as shown in FIG. 12B. Then the relation of photoelectric conversion efficiency after a "torsion test" to the percentage K of overall volume of prismatic crystalline grains, each having an angle F of 20° or less, with respect to the overall volume of the first i-layer was checked. The result is shown in FIG. 12A. It was found that when the percentage K was 70% or more, good photoelectric conversion efficiencies were presented and that when the percentage K was less than 70%, the open-circuit voltages were decreased and the photoelectric conversion efficiencies were lowered. The "torsion test" was conducted in compliance with JIS C8917 A-10 for a crystalline solar cell. Conditions were such that torsion of height h=5 mm was repetitively given fifty times for the area of 10 cm×10 cm.

(2) The lower conductive layer 102 of the present invention was made so that surface roughness Ra in the length of about several ten micrometers of the surface thereof was in the range of 0.1 μm to 1 μm inclusive. Then, (surface roughness)×(refractive index of the first i-layer) becomes nearly equal to the wavelengths of visible light or infrared light, and the optical confinement effect is thus demonstrated, thereby remarkably increasing the short-circuit photocurrent of the photoelectric conversion element.

Long-wavelength light not absorbed inside the first i-layer is reflected by the lower conductive layer, and the reflected light is again incident into the i-layer. Since the light is scattered by the surface of the lower conductive layer, it does not undergo interference inside the i-layer, and there is no region strongly absorbing the light. Thus, the optical degradation can be suppressed further. Similarly, a region absorbing only a little light is absent, and the open-circuit voltage can thus be increased.

Figure 6:
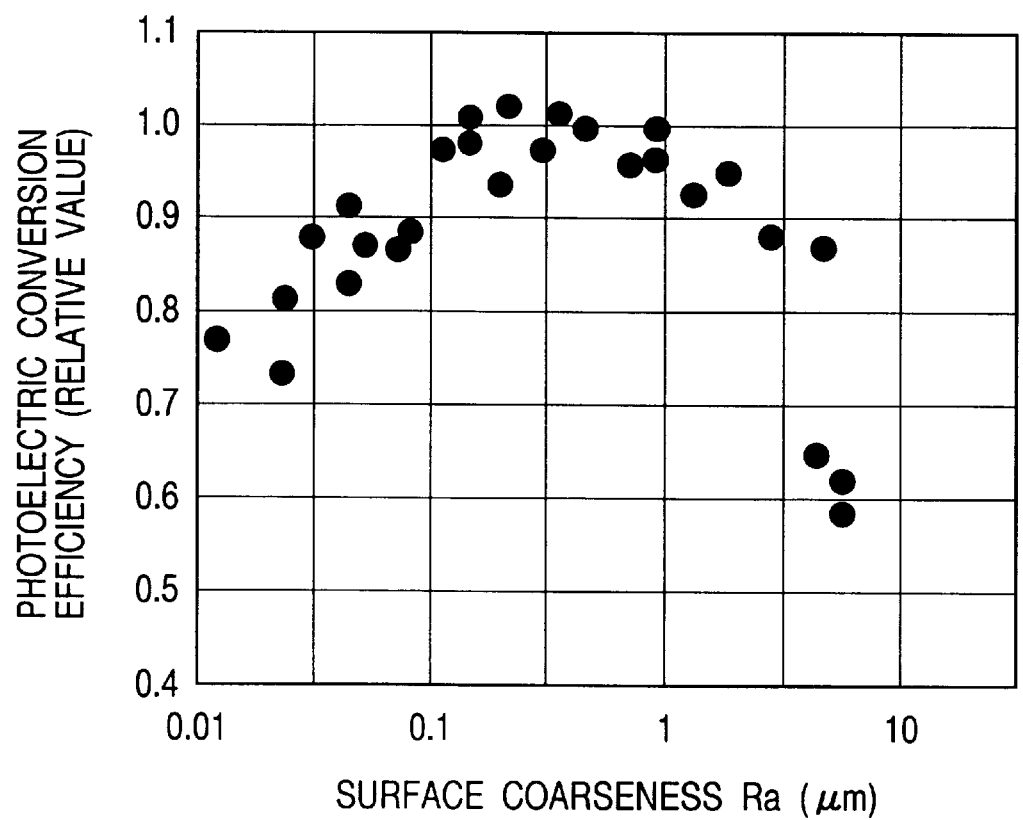
FIG. 6 is a drawing to show the relationship between surface roughness of the lower conductive layer and photoelectric conversion efficiency.

The relationship was checked between surface roughness and photoelectric conversion efficiency. The results are shown in FIG. 6. It was proved that excellent conversion efficiencies were shown in the above-stated range of surface roughness.

(3) When regions wherein angle G between a normal line to the surface of the lower conductive layer in a fine area of approximately several hundred Å and a normal line to the principal plane of a substrate is between 15° and 45° both inclusive are 80% or more of the total surface region, thickness distribution of the first i-layer is small, and only a small region having an extremely small thickness is present. Thus, the leak current is small, and the open-circuit voltage can be increased. In addition, the optical confinement effect is further enhanced.

Figure 7:
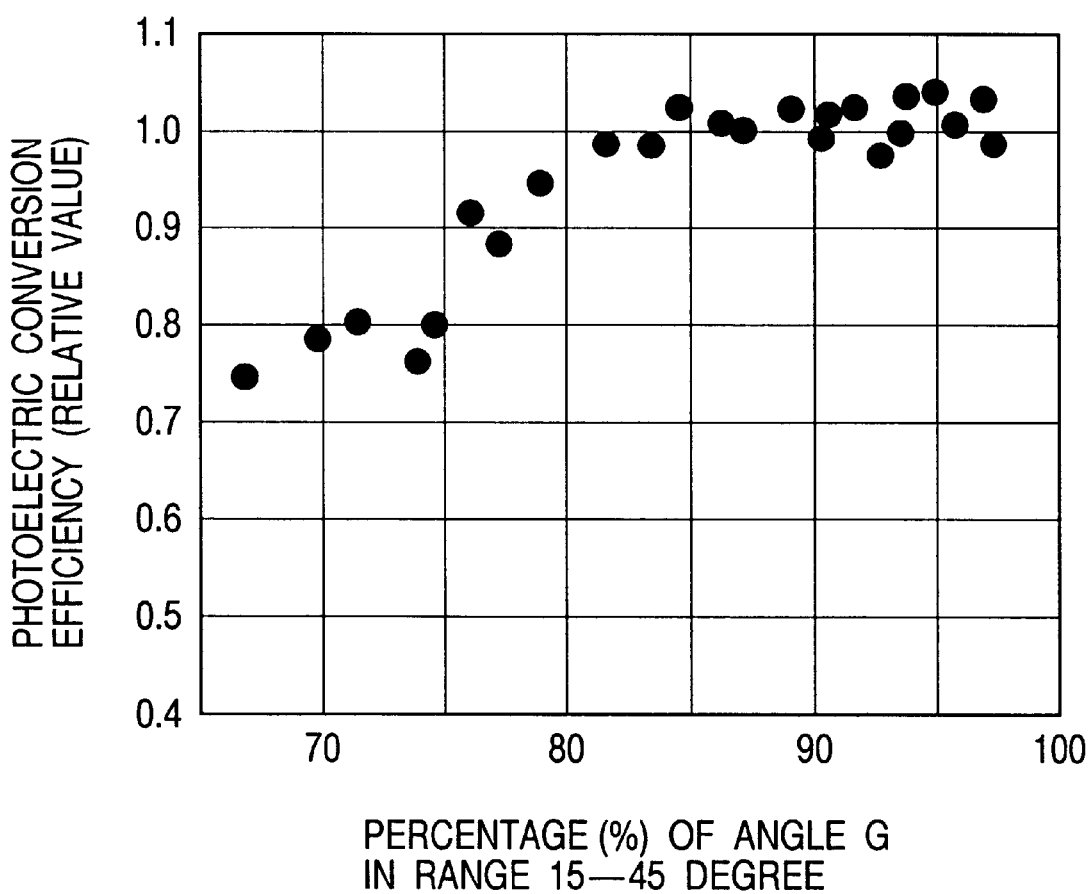
FIG. 7 is a drawing to show the relationship between photoelectric conversion efficiency and percentage of angle G defined in FIG. 1A in the range of 15° to 45° both inclusive.

The relationship was checked between photoelectric conversion characteristics of a solar cell after the "torsion test" and distribution of an angle (angle G) made between the normal line to the fine area of the lower conductive layer and the normal line to the principal plane of the substrate. The angle G is illustrated in FIG. 1A. FIG. 7 shows the relationship of the above angle G to photoelectric conversion efficiency after the "torsion test." It was found that when the percentage of angle G was 80% or less, the shunt resistance was lowered (weak short-circuit condition), thereby lowering the photoelectric conversion efficiency.

(4) Photocarriers generated in the i-layer migrate because of an internal electric field, and the internal electric field is nearly parallel to straight lines taking shortest courses between the first doped layer and the second doped layer. Therefore, in the present invention, longitudinal directions of prismatic crystalline grains contained in the i-layer are made nearly parallel to the straight lines taking the shortest courses between the first doped layer and the second doped layer, and lengths of the prismatic crystalline grains in the longitudinal direction are determined between 100 Å and 0.3 μm inclusive, which decreases chances of passage of carriers through interfaces present between crystal grains, thereby increasing the fill factor and short-circuit current.

Since the chances of passage of carriers through the interfaces are decreased, a rate of recombination of carriers can be decreased. Accordingly, optical degradation can be suppressed further. Since directions of prismatic crystalline grains are almost aligned, the interface state density of prismatic crystalline grains is small. Therefore, the open-circuit voltage can be increased.

Further, an absorption coefficient of light is higher than that of monocrystalline silicon and an absorption coefficient of long-wavelength light is higher than those of amorphous silicon based semiconductor materials. Therefore, the light is effectively absorbed up to the long wavelengths (infrared light), and sufficient short-circuit current can be obtained even in the thickness of about 3 μm.

Since an area between prismatic crystalline grains is occupied by the good amorphous silicon based semiconductor material containing hydrogen, the probability that photocarriers will be trapped in this area is almost zero.

As a whole, the most longitudinal directions of prismatic crystalline grains have angles in the range of 10° to 50° both inclusive with respect to the normal line to the principal plane of the substrate, and they can thus relax external torsion or the like. Therefore, separation of film will not occur when a long substrate is wound around a roll in carrying out the roll-to-roll method. Since film separation does not occur, the photoelectric conversion element can be formed even on a curved substrate. Similarly, it is also easy to use the photoelectric conversion element of the present invention formed on a flat substrate in a curved state. Particularly, when the photoelectric conversion element of the present invention is used as a solar cell, it can also be used on a curved surface such as a building wall.

Additionally, since the short-circuit current can be increased as described above, the first i-layer can be formed in a smaller thickness, which can improve optical degradation, increase productivity, and decrease power cost.

(5) Another feature is that in the i-layer, fine areas of the amorphous silicon based semiconductor material exist at a volume percentage of 50% or less with respect to the overall region of the i-layer. This can make the open-circuit voltage higher than that of the photoelectric conversion element in which the entirety of the first i-layer is made of the microcrystalline silicon based semiconductor material.

Although the reason is not clear, the leak current can be decreased, so that the open-circuit voltage can be made higher. Further, the strength against external force becomes higher than that of the photoelectric conversion element in which the entirety of the first i-layer is made of the microcrystalline silicon based semiconductor material. Since the flexibility of the Si—Si—network of in the amorphous silicon based material is higher than that of in the microcrystalline silicon based material, the areas of the amorphous silicon based semiconductor material contained in the first i-layer are considered to be effective upon relaxation of external force. Further, they are also considered to be similarly effective upon relaxation of internal stress.

Since the optical degradation becomes unignorably prominent at volume percentages of 50% and more, a desired element structure is the stacked having the structure of a-Si/$\mu$ c-Si, for example.

Figure 1B:
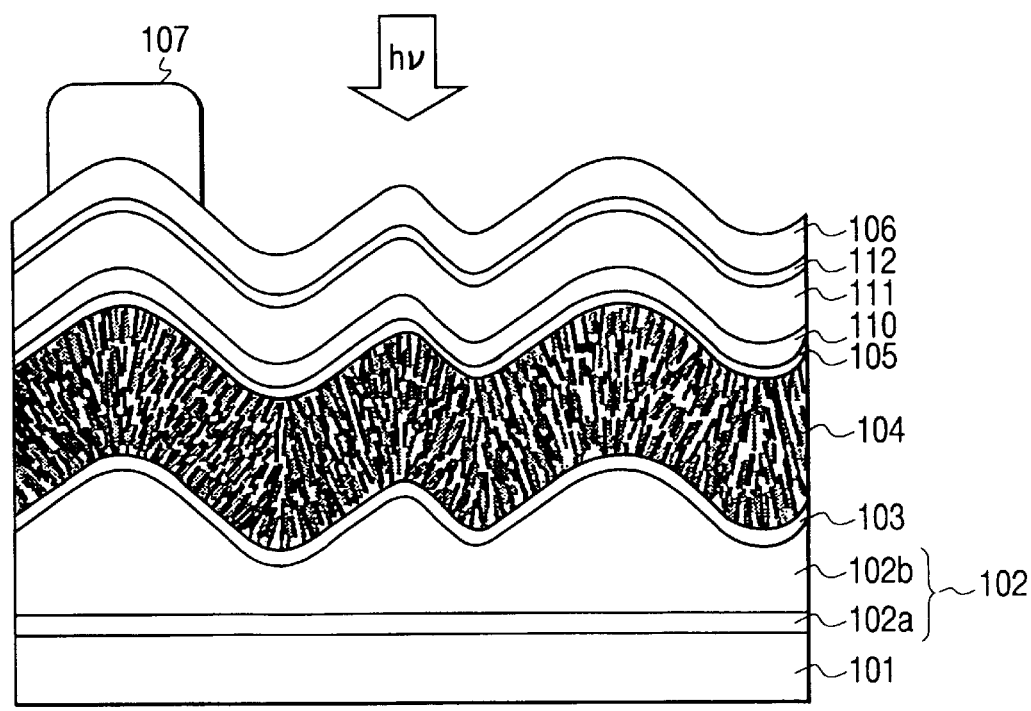

(6) The stacked cell as shown in FIG. 1B is characterized in that third doped layer 110, second i-layer 111, and fourth doped layer 112 are successively stacked on the above-stated pin junction 103 to 105 and in that the thickness of the second i-layer 111 is in the range of 0.1 $\mu$m to 0.4 $\mu$m both inclusive. Spectral sensitivity to light can be increased in a wider wavelength region by making the second i-layer of a semiconductor material with a larger light absorption coefficient of short-wavelength light, e.g. a-Si, and making the first i-layer of a semiconductor material with a larger light absorption coefficient of long-wavelength light, e.g., $\mu$ c-Si, in this order from the light incidence side as described.

Further, the open-circuit voltage can be made higher than that of the photoelectric conversion element wherein the first i-layer is made of $\mu$ c-Si, which can increase the photoelectric conversion efficiency. Since the second i-layer of $\mu$ c-Si can be made in a smaller thickness by connecting the i-layers of different spectral sensitivities as described above, the fill factor (FF) of the photoconductive characteristic can be improved.

Since the thickness of the second i-layer of the present invention is thin, between 0.1 $\mu$m and 0.4 $\mu$m both inclusive, as much optical degradation can be suppressed as possible, even if amorphous semiconductor is used for the second i-layer.

Further, though the reason is indefinite, the leak current of the photoelectric conversion element can be decreased by stacking of the second i-layer of amorphous silicon based semiconductor material. Therefore, the open-circuit voltage can be increased further.

Particularly, when the photoelectric conversion element of the present invention is used as a photosensor or as an image sensor, the decrease of leak current is important. When the photoelectric conversion element of the present invention is used as a solar cell, it can output a high open-circuit voltage even under low light illumination. For example, no extreme drop of power generation efficiency will take place even on a cloudy day or during a time near dawn or dusk.

Since the lower conductive layer is not flat as described above, the light does not interfere inside the second i-layer. Therefore, there is no region strongly absorbing the light, and the optical degradation can be suppressed further. Since the region absorbing only a little light is absent similarly, the open-circuit voltage can be increased.

(7) Method for forming the first i-layer

The i-layer 104 is characterized by being formed by plasma enhanced CVD using an electromagnetic wave having a frequency in the range of 30 MHz to 600 MHz both inclusive and under such conditions that the pressure is between 1 mTorr and 1 Torr both inclusive, hydrogen gas and a gas containing silicon are used as source gases, and a percentage of the gas containing silicon to the hydrogen gas is in the range of 0.5% to 30% both inclusive.

Since the plasma enhanced CVD using the electromagnetic wave having the frequency in the above range can induce the plasma at lower pressure than RF (13.56 MHz industrially applied) plasma enhanced CVD, it is free from the generation of polysilane in vapor phase and can thus make the microcrystalline silicon based semiconductor material with high quality.

Since the plasma can be induced at low pressure, the plasma can be expanded, which is very suitable for the fabrication of a large-area photoelectric conversion element. For these reasons, the rate of deposition can be increased, and the throughput is increased thereby, which is industrially advantageous. Since the gas containing silicon is diluted with a large amount of hydrogen gas, a larger amount of radicals containing hydrogen can be supplied to the surface for a film to be formed thereon than in normally forming the thin film of amorphous silicon based semiconductor, so that the microcrystalline silicon based semiconductor thin film can be formed with good quality.

Since a negative self-bias normally appears at the electrode for discharge, positive ion species with high energy can be prevented from hitting the surface for the film to be formed thereon, so that the microcrystalline silicon based semiconductor thin film can be formed with good quality.

Although the reason is not yet clear, the microcrystalline structure according to the present invention can be made with good reproducibility by the method described above. Since the above method has higher gas decomposition efficiency than the RF plasma enhanced CVD process, it shows excellent gas use efficiency, thus being industrially advantageous.

(8) Method for forming the second i-layer

The material for the second i-layer is selected from amorphous silicon based semiconductor materials, specific examples of which are a-Si, a-SiC, and a-SiO. Particularly, a-Si is excellent. For making the i-layer more intrinsic, B may be added, for example. A concentration of H, Cl, and F atoms for compensating for unbound bonds (dangling bonds) is preferably between 0.1% and 10% both inclusive. A method for forming this layer is one of the ordinary plasma enhanced CVD processes. Among such processes, RF plasma enhanced CVD is preferred. The rate of deposition is preferably between 1 Å/sec and 20 Å/sec both inclusive, the temperature of formation is preferably between 150° C. and 350° C. both inclusive, and the pressure is preferably between 0.1 Torr and 5 Torr both inclusive. Particularly, in making the second i-layer of microcrystalline structure, the doped layer is made preferably under such conditions that hydrogen gas and a gas containing silicon are used as source gases, and a percentage of the gas containing silicon to the hydrogen gas is between 2% and 50% both inclusive.

(9) Another feature is such that at least one layer of the first doped layer 103, the second doped layer 105, the third doped layer 110, and the fourth doped layer 112 is made of a microcrystalline silicon based semiconductor material.

Since use of the microcrystalline silicon based semiconductor material for the doped layer can increase the carrier density of the layer, the open-circuit voltage of the photoelectric conversion element is increased. Further, since the microcrystalline silicon based semiconductor material has a smaller absorption coefficient in the visible light region than the amorphous silicon based semiconductor materials, it increases the short-circuit current when used for the window layer on the light incidence side.

Yet further, when the microcrystalline silicon based semiconductor material is used for the first doped layer 103 and the second doped layer 105, the interface state density is small, because there is no sudden change at the interface to the first i-layer 104. Thus, the fill factor of the photoconductive characteristic is increased.

Figure 5:
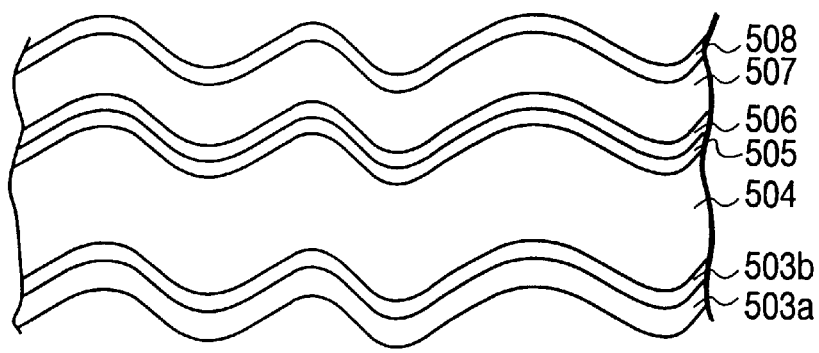
FIG. 5 is a drawing to show a photoelectric conversion element of the present invention featuring the first doped layer.

(10) As shown in FIG. 5, the first doped layer is preferably made in a stacked structure comprised of a layer (503a) of an amorphous silicon based semiconductor material on the lower conductive layer side and a layer (503b) of a microcrystalline silicon based semiconductor material on the first i-layer side. The third doped layer may be constructed of the same structure. This application of the stacked structure to the doped layer can improve the fill factor of a photoelectric conversion element.

For forming the microcrystalline silicon based semiconductor material, a large amount of hydrogen gas is often made to flow in the plasma. In that case, for example, when tin oxide is used for the lower conductive layer, the tin oxide will be reduced, which could result in the failure to form a good semiconductor junction.

(11) Method for forming the transparent, conductive layer of the present invention.

The transparent, conductive layer is made of a material selected from zinc oxide, tin oxide, indium oxide, ITO, and zinc sulfide. The material is, however, preferably zinc oxide or tin oxide with regard to ease of surface configuration and the control.

The conductive layer is normally made at a deposition rate in the range of 10 (Å/sec) to 200 (Å/sec) both inclusive, using high deposition rate DC magnetron sputtering. In addition, it is important to make the layer at the temperature in the range of 100° C. to 500° C. both inclusive. Particularly, the temperature is preferably between 150° C. and 400° C. both inclusive. The transparent, conductive layer having the cross-sectional configuration as in the present invention can be obtained at the deposition rate and formation temperature described above, and the transmittance thereof is 90% or more for light of 500 nm and higher. After the layer is formed by the above method, the surface of the substrate may be etched moderately with an acid solution such as $HNO_3$, HF, HCl, or $H_2SO_4$, to make the surface uneven.

The other components will be described.

Substrate

The substrate 101 is made of a material selected from metals, plastics, glass materials, ceramics, and bulk semiconductors. The surface of the substrate may have fine unevenness. The substrate having a long shape can be applied to continuous film formation. Particularly, stainless steel or polyimide is preferred, because they have flexibility.

Reflecting layer

The reflecting layer 102a functions as an electrode and as a reflecting layer for reflecting the light arriving at the substrate to allow the reflected light to be again utilized in the semiconductor layers. It is made by a method selected from vapor deposition, sputtering, plating, and printing of Al, Cu, Ag, or Au.

The surface has unevenness, which functions to lengthen optical pathlengths in the semiconductor layers of the reflected light and to increase the short-circuit current.

If the substrate is electrically conductive, the reflecting layer does not always have to be present.

Upper transparent electrode

If the thickness is properly set, the upper transparent electrode 106 can also serve as a reflection preventing layer.

The transparent electrode 106 is made by a method selected from vapor deposition, CVD, spraying, spin-on, and dipping with a material such as ITO, ZnO, or $InO_3$. These compounds may contain a substance for changing electric conductivity.

Collector electrode

Figure 3:
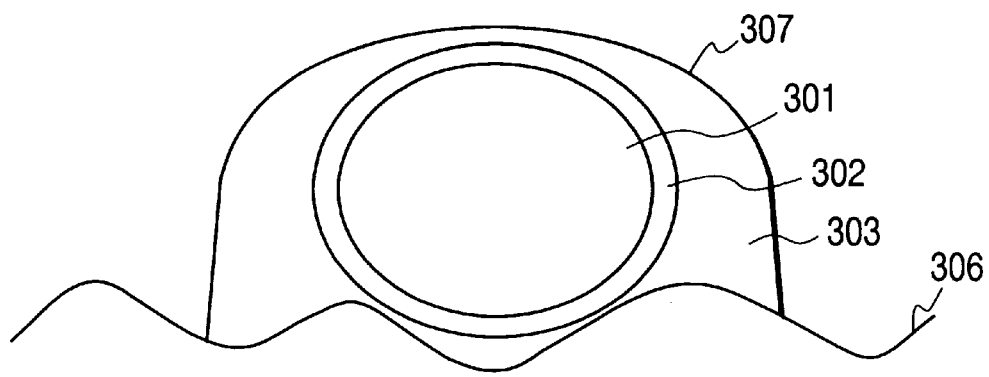
FIG. 3 is a drawing to show an example of a collector electrode.

The collector electrode 107 is provided for increasing collection efficiency. A method for forming the collector electrode may be selected from a method for forming a metal electrode pattern by sputtering with a mask, a method of printing an electroconductive paste or a soldering paste, a method for bonding a metal wire with an electroconductive paste, and so on. An example using a copper wire is shown in FIG. 3. A silver cladding layer is made around a fine copper wire. This layer functions to reduce contact resistance with the copper wire. Further, a carbon layer with a binder of acrylic resin is made around the silver cladding layer. This layer functions to maintain adhesion to the upper transparent electrode and functions to reduce contact resistance with the silver cladding layer. It also functions to prevent silver in the silver cladding layer from diffusing into the photovoltaic layer.

Figure 13:
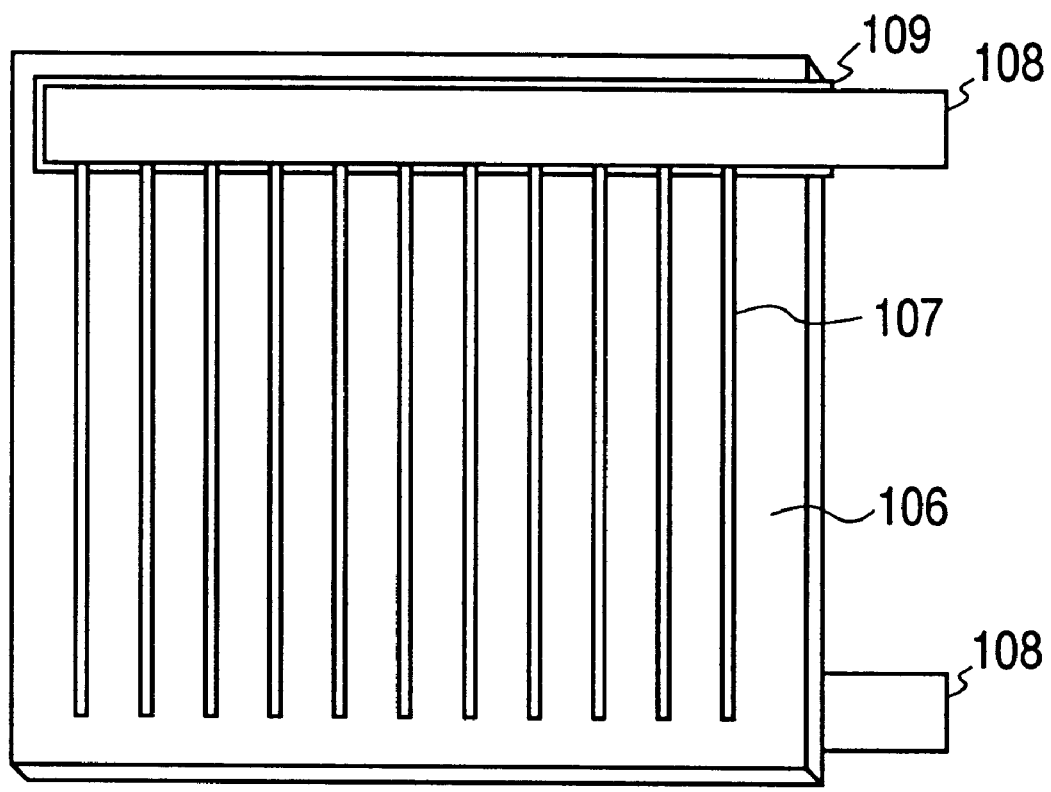
FIG. 13 is an example of the photoelectric conversion element of the present invention provided with bus-bars.

Further, bus-bars, etc. for taking power out are formed as shown in FIG. 13. A plurality of collector electrodes are arranged without intersection on the surface of the element and one ends thereof are in electrical contact with the bus-bar 108. The bus-bar 108 is formed on 107 and a metal material with high conductivity, such as a Cu plate, is used therefor. An electrically insulating, double-sided adhesive tape is interposed between the bus-bar and the upper transparent electrode to make the bus-bar adhere to the upper transparent electrode.

Figure 4A:
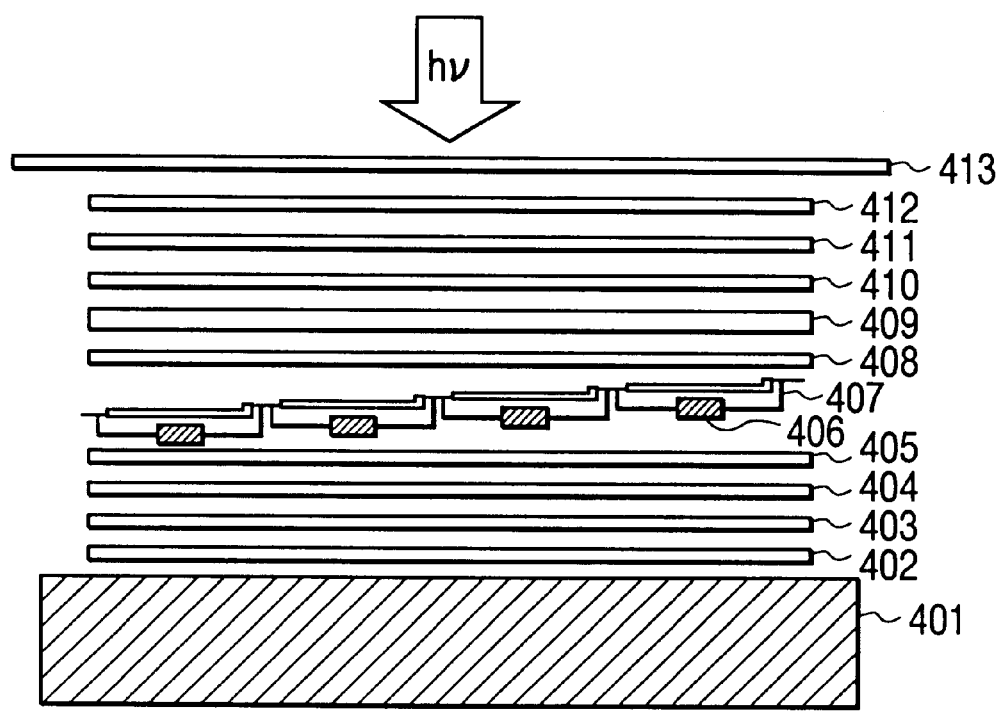
FIGS. 4A and 4B are drawings to show an example of a photoelectric conversion element module according to the present invention.
Figure 4B:
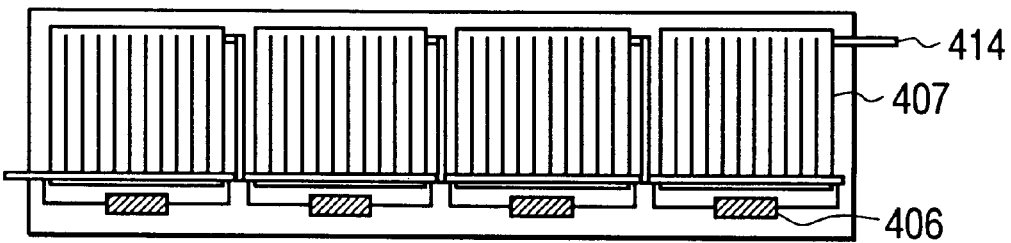

FIGS. 4A and 4B show an example of a module of a photoelectric conversion element according to the present invention. As shown in FIGS. 4A and 4B, a plurality of photovoltaic elements are connected in series, and a bypass diode 406 is connected in parallel with each photoelectric conversion element. This is advantageous in that even if one photoelectric conversion element is shadowed, all voltages generated by the other photoelectric conversion elements can be prevented from being applied to the shadowed photoelectric conversion element. Since the photovoltaic module of the present invention is sealed by fluororesin and support substrate after placement of each member as shown in FIGS. 4A and 4B, it is free from intrusion of water vapor.

EXAMPLES

The present invention will be described in further detail with examples of solar cells as photoelectric conversion elements, but it is noted that the present invention is by no means intended to be limited to the examples.

Example 1

The solar cell of FIG. 1A having one pin junction was fabricated. Specifically, the solar cell comprised a stainless steel (SUS having an area of 10×10 cm$^2$ and a thickness of 0.2 mm)/a Ag reflecting layer a ZnO transparent, conductive layer a first doped layer of a-Si:H:P/a first i-layer of $\mu$ c-Si:H/a second doped layer of $\mu$ c-Si:H:B/an upper transparent electrode of ITO/a Cu collector electrode wire/Ag/ material of C (FIG. 3).

Figure 8:
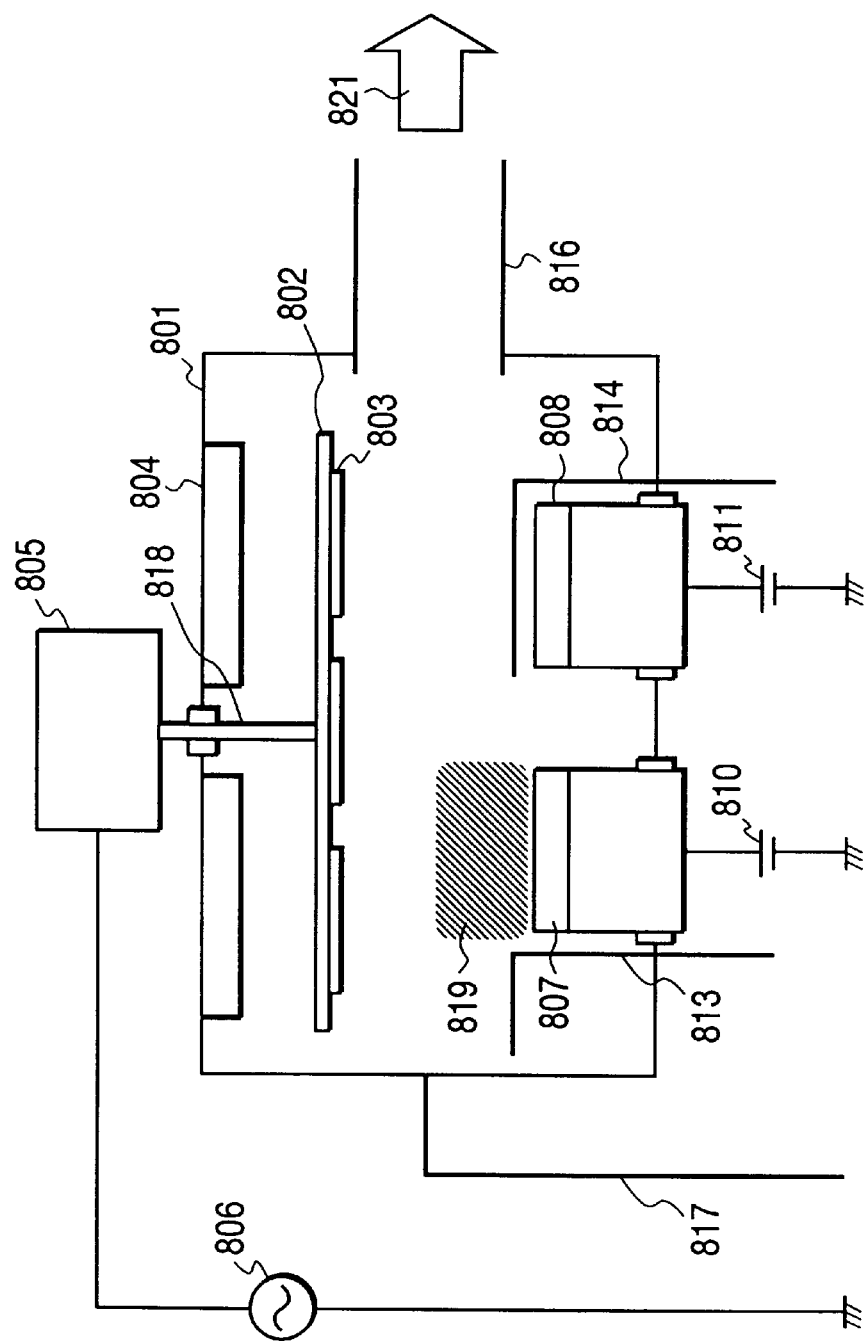
FIG. 8 is a drawing to show an apparatus for forming the lower conductive layer and upper transparent electrode of the photoelectric conversion element of the present invention.
Figure 9:
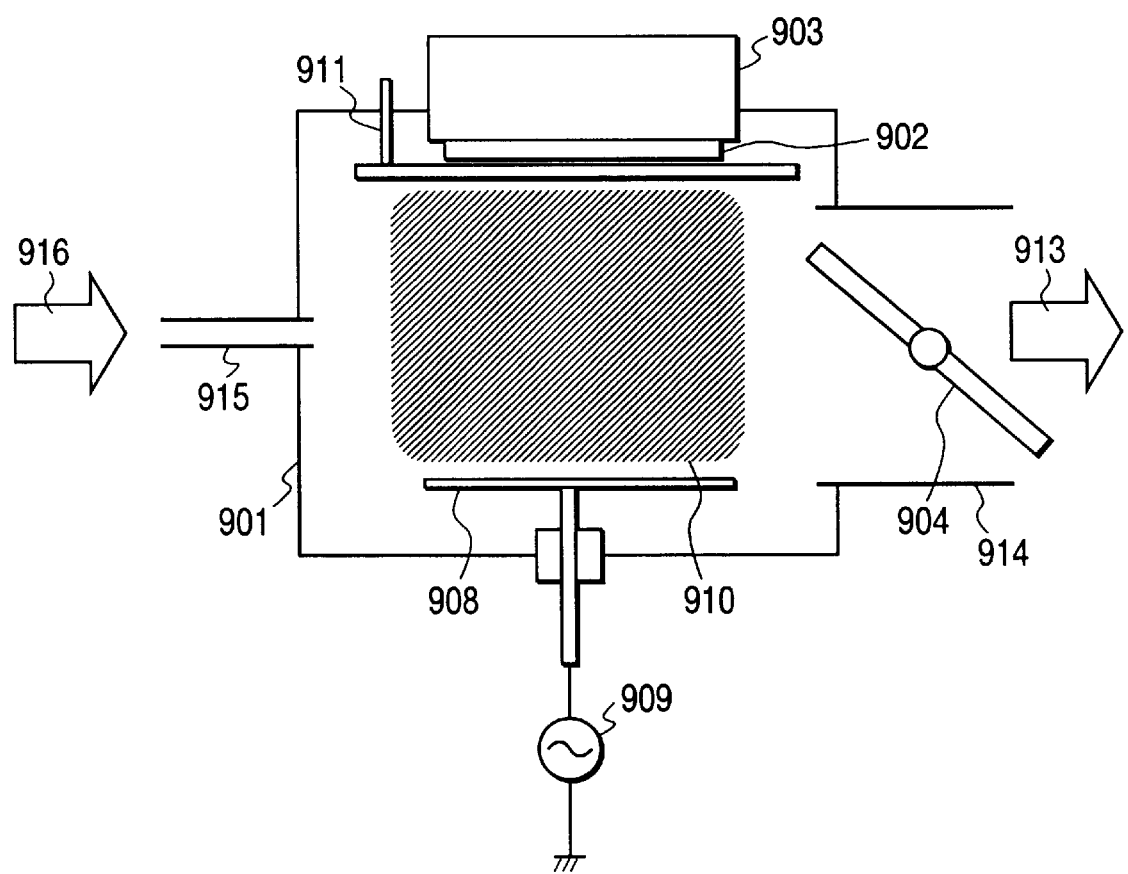
FIG. 9 is a drawing to show an apparatus for forming the photovoltaic layer of the photoelectric conversion element of the present invention.

In this example, the transparent, conductive layer was made by sputtering using the apparatus of FIG. 8, the photovoltaic layer was made using the apparatus of FIG. 9, the first i-layer was made by plasma enhanced CVD using the high frequency of 500 MHz, the doped layers were made by RF plasma enhanced CVD, and the upper transparent electrode layer was made by sputtering.

Procedures for forming the lower conductive layer of the reflecting layer and the transparent, conductive layer by sputtering will be described. FIG. 8 shows the apparatus that can carry out sputter etching and DC magnetron sputtering process, wherein reference numeral 801 designates a cylindrical deposition chamber, 802 a substrate holder, 803 the substrate, 804 a heater, 805 a matching box, 806 an RF power supply, 807 a metal target for formation of a reflecting layer, 808 a target for formation of transparent, conductive layer, 810 and 811 DC power supplies, 813 and 814 shutters, 816 an exhaust pipe, 817 a gas inlet pipe, 818 a rotary shaft, and 819 the plasma. In addition, there are a gas supply device connected to the gas inlet pipe 817 and a vacuum pump connected to the exhaust pipe 816, though not illustrated. Numeral 821 represents an arrow indicating a direction of exhaust. First, the substrate 803, cleaned with an acid and cleaned with an organic solution, is attached to the disk substrate holder, and the rotary shaft 818 being a center axis of this disk substrate holder is rotated. Then the inside of the deposition chamber is evacuated to a vacuum of 5×10$^{-6}$ Torr by use of an oil diffusion pump/rotary pump not illustrated. Then Ar is introduced through the gas inlet pipe, and the RF power is introduced from the RF power supply 806 to the inside of the deposition chamber, thereby inducing Ar plasma. The matching circuit 805 is adjusted so as to minimize reflected power. On this occasion, the substrate is sputter-etched (or reversely sputtered) to have a cleaner surface. Then the heater is set to achieve the temperature for formation of a reflecting layer. When the predetermined temperature is achieved, the DC power supply 810 is turned on to induce the Ar plasma 819. Then the shutter 813 is opened. When the reflecting layer is made in a predetermined thickness, the shutter is closed and the DC power supply is turned off. Next, the heater is set so as to achieve the temperature for formation of a transparent, conductive layer. When the predetermined temperature is achieved, the DC power supply 811 is turned on to induce the Ar plasma. Then the shutter 814 is opened. After the transparent, conductive layer is made in a predetermined thickness, the shutter is closed and the DC power supply is turned off.

FIG. 9 shows the apparatus that can carry out the plasma enhanced CVD process, in which reference numeral 901 designates a reaction chamber, 902 the substrate on which the lower conductive layer was made, 903 a heater, 904 a conductance valve, 908 a high-frequency electrode, 909 a high-frequency power supply (500 MHz) having a built-in matching circuit, 910 the plasma, 911 a shutter, 914 an exhaust pipe, and 915 a gas inlet pipe. Numeral 913 denotes a direction of exhaust and 916 a gas introducing direction. Although not illustrated, the oil diffusion pump/vacuum pump such as the rotary pump are connected to the exhaust pipe of the drawing, and the gas supply device is connected to the gas inlet pipe as illustrated. The plasma enhanced CVD system is constructed as described above.

Actual layer formation is carried out as follows, using this plasma enhanced CVD system. First, the substrate 902 on which the lower conductive layer was made is attached to the heater 903 inside the reaction chamber 901, and the inside of the reaction chamber is evacuated by the oil diffusion pump/the vacuum pump such as the rotary pump before the pressure inside the reaction chamber becomes 1×10$^{-4}$ Torr or less. When the pressure becomes 1×10$^{-4}$ Torr or less, a gas such as H$_2$ or He is introduced from the gas inlet pipe 915 into the reaction chamber, and the heater is powered so as to set the substrate 902 at a desired temperature. When the temperature of the substrate becomes stable, the source gas is introduced from the gas inlet pipe, and the high-frequency power supply 909 is turned on to introduce the high-frequency power from the high-frequency electrode 908 into the reaction chamber. When the plasma 910 is induced, the conductance valve 904 is adjusted to attain a desired pressure. On that occasion, the matching circuit is preferably adjusted to minimize reflected power. Then the shutter 911 is opened. When the layer is made in a desired thickness, the shutter is closed, and the introduction of high-frequency power and the introduction of source gas is stopped. Then preparation is made for formation of the next layer. If this apparatus is used with the RF plasma enhanced CVD process, the above high-frequency power supply 909 is replaced by the RF power supply (13.56 MHz) to introduce the RF power to induce the plasma.

Specific conditions are shown in Table 1A.

TABLE 1A

| Layer | | Material | Temperature (° C.) | Thick ($\mu$m) | Gas | Method |
|---|---|---|---|---|---|---|
| Lower conductive layer | reflecting layer | Ag | 25 | 0.1 | Ar | SP method |
| | transparent conductive layer | ZnO | 250 | 1.0 | Ar | SP method |

TABLE 1A-continued

| Layer | | Material | Temperature (° C.) | Thick (µm) | Power frequency (MHz) | Ratio of flow rates SiH$_4$/H$_2$ | Pressure (Torr) |
|---|---|---|---|---|---|---|---|
| Photovoltaic layer | 1st doped layer | a-Si:H:P | 350 | 0.05 | 13.56 | 0.08 | 1.0 |
| | 1st i-layer | µ c-Si:H | 400 | 0.80 | 500 | 0.04 | 0.01 |
| | 2nd doped layer | µ c-Si:H:B | 200 | 0.006 | 13.56 | 0.02 | 1.5 |

| Layer | Material | Temperature (° C.) | Thick (µm) | Gas | Method |
|---|---|---|---|---|---|
| Upper electrode | ITO | 160 | 0.08 | Ar | SP method |

SP method: sputtering

As shown in FIG. 13, the electrically insulating, double-sided adhesive tape was placed on one side of the substrate up to the upper transparent electrode (ITO), one end of collector electrodes each comprised of the Cu wire, Ag cladding layer, and carbon paste shown in FIG. 3 are stuck to the double-sided adhesive tape, a bus-bar is stuck to the double-side adhesive tape from above the collector electrodes, and the whole is heated to fuse the carbon paste, thereby fixing the collector electrodes to the bus-bar.

Several solar cells (Ex. 1) were made in the same structure as above. The cross-sectional shape of one of them was observed by a transmission electron microscope (TEM), which indicated that the first i-layer was made in such structure that the longitudinal directions of prismatic crystalline grains are inclined with respect to the direction of the normal line to the substrate as shown in FIG. 1A or 1B. The surface roughness Ra of the lower conductive layer (the transparent, conductive layer and the reflecting layer) was measured, which showed that an average per 50 µm length was 0.32 µm. A percentage of angles G (each of which is an angle between a normal line to a fine area of the lower conductive layer and the normal line to the principal plane of the substrate) in the range of 15° to 45° both inclusive was calculated, and the percentage was 91%. The percentage of the overall volume of prismatic crystalline grains, each having the angle F of 200 or less, was 92% with respect to the overall volume of the i-layer.

Comparative Example 1

Figure 2:
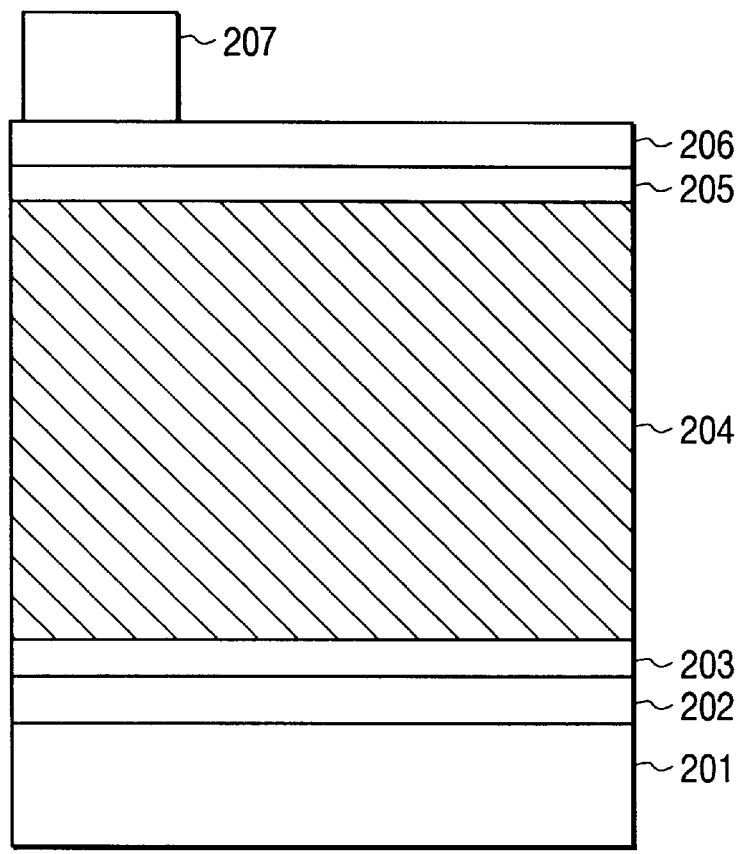
FIG. 2 is a drawing to show a conventional photoelectric conversion element.

The solar cell having the cross-sectional shape of FIG. 2 was made in such structure that the lower conductive layer was an almost flat film of only Ag by the ordinary sputtering process without provision of the transparent, conductive layer. The first i-layer was made under the conditions shown in Table 1B by RF plasma enhanced CVD. The solar cell (the photoelectric conversion element of FIG. 2) was fabricated in the same manner as in Example 1 except for the above.

The conditions of formation are shown in Table 1B.

TABLE 1B

| Layer | Material | Temperature (° C.) | Thick (µm) | Gas | Method |
|---|---|---|---|---|---|
| Lower conductive layer | Ag | 25 | 0.1 | Ar | SP method |

| Layer | | Material | Temperature (° C.) | Thick (µm) | Power frequency (MHz) | Ratio of flow rates SiH$_4$/H$_2$ | Pressure (Torr) |
|---|---|---|---|---|---|---|---|
| Photovoltaic layer | 1st doped layer | a-Si:H:P | 350 | 0.05 | 13.56 | 0.08 | 1.0 |
| | 1st i-layer | µ c-Si:H | 400 | 0.80 | 13.56 | 0.03 | 1.2 |
| | 2nd doped layer | µ c-Si:H:B | 200 | 0.006 | 13.56 | 0.02 | 1.5 |

| Layer | Material | Temperature (° C.) | Thick (µm) | Gas | Method |
|---|---|---|---|---|---|
| Upper electrode | ITO | 160 | 0.08 | Ar | SP method |

SP method: sputtering

Several solar cells (Comp. Ex. 1) were fabricated in the same structure. The cross-sectional shape of one of them was observed by the transmission electron microscope (TEM), which indicated that the first i-layer was made of prismatic microcrystalline silicon as shown in FIG. 2. The surface roughness Ra of the lower conductive layer was measured, which showed that the average per 50 µm length was 0.02 µm.

First, the initial characteristics (photoconductive characteristic, leak current, and open-circuit voltage under low illuminance) were measured for the solar cells (Ex. 1) of Example 1 and the solar cells (Comp. Ex. 1) of Comparative Example 1.

The photoelectric conversion efficiency, the open-circuit voltage, and the short-circuit photocurrent were measured using a solar simulator (AM 1.5, 100 mW/cm$^2$, surface temperature 25° C.), which confirmed that the photoelectric conversion elements of the present invention were 1.29 times, 1.04 times, and 1.23 times, respectively, better than those of the comparative example.

Next, the open-circuit voltage was measured under a fluorescent lamp (of low illuminance) of the approximately 500 lx illuminance, which showed that the solar cells of (Ex. 1) were 1.2 times better than those of (Comp. Ex. 1). The leak current was measured with a backward bias being applied at a dark place, which indicated that the leak currents of the solar cells (Ex. 1) of the present invention were about one eighth or so of those Comparative Example 1 (Comp. Ex. 1) and that the solar cells of the present invention were thus superior.

The light-soaking test was next conducted for the solar cells of Ex. 1 and Comp. Ex. 1. After exposure for 1000 hours to the above simulator (AM 1.5, 100 mW/cm$^2$, surface temperature 50° C.), none exhibited a failure of appearance.

After the light-soaking test, the photoelectric conversion efficiency, open-circuit voltage, short-circuit photocurrent, open-circuit voltage under low illuminance, and leak current were measured, which showed that differences were observed in drops of the open-circuit voltage under low illuminance and the leak current before and after the test.

A ratio of open-circuit voltages under low illuminance before and after the test (low-illuminance open-circuit voltage after test/low-illuminance open-circuit voltage before test) was 0.95 for Ex. 1 or 0.92 for Comp. Ex. 1. Further, a ratio of leak currents before and after the test (leak current after test/leak current before test) was 1.2 for Ex. 1 or 2.2 for Comp. Ex. 1.

It was thus proved that the photoelectric conversion element of the present invention was better than the conventional photoelectric conversion element, as described above.

Further, the "torsion test" described previously was conducted. The two solar cells showed no failure of appearance after the test.

After the torsion test, the photoelectric conversion efficiency, open-circuit voltage, short-circuit photocurrent, open-circuit voltage under low illuminance, and leak current were measured, and differences were observed in drops of the photoelectric conversion efficiency, open-circuit voltage, open-circuit voltage under low illuminance, and leak current before and after the test.

A ratio of photoelectric conversion efficiencies before and after the test (photoelectric conversion efficiency after test/photoelectric conversion efficiency before test) was 0.98 for Ex. 1 or 0.93 for Comp. Ex. 1. A ratio of open-circuit voltages before and after the test (open-circuit voltage after test/open-circuit voltage before test) was 0.99 for Ex. 1 or 0.94 for Comp. Ex. 1.

The ratio of open-circuit voltages under low illuminance before and after the test (low-illuminance open-circuit voltage after test/low-illuminance open-circuit voltage before test) was 0.96 for Ex. 1 or 0.87 for Comp. Ex. 1. Further, the ratio of leak currents before and after the test (leak current after test/leak current before test) was 1.1 for Ex. 1 or 3.1 for Comp. Ex. 1.

It was proved that the photoelectric conversion element of the present invention was better than the conventional photoelectric conversion element, as described above.

Similarly, a hailstorm test was conducted according to JIS C 8917 related to the crystalline solar cells. Ice balls about 25 mm in diameter were dropped about ten times at a final velocity 23 m/sec. The same evaluations as described above were conducted after the test, which showed that the solar cells of Ex. 1 were better than those of Comp. Ex. 1.

Example 2

The solar cell of FIG. 1B was fabricated as another example. Specifically, several solar cells (Ex. 2) were made comprising a stainless steel substrate (SUS 430 having an area of 10×10 cm$^2$ and a thickness of 0.2 mm)/an Al reflecting layer a ZnO transparent, conductive layer a first doped layer of a-Si:H:P/a first i-layer of $\mu$ c-Si:H/a second doped layer of $\mu$ c-Si:H:B/a third doped layer of a-Si:H:P/a second i-layer of a-Si:H/a fourth doped layer of $\mu$ cSi:H:B/ an upper transparent electrode of ITO/a Cu collector electrode wire/Ag/material of C.

The formation conditions are shown in Table 2.

TABLE 2

| Layer | | Material | Temperature (° C.) | Thick (μm) | Gas | Method |
|---|---|---|---|---|---|---|
| Lower conductive layer | reflecting layer | Al | 30 | 0.1 | Ar | SP method |
| | transparent conductive layer | ZnO | 250 | 1.0 | Ar | SP method |

| Layer | | Material | Temperature (° C.) | Thick (μm) | Power frequency (MHz) | Ratio of flow rates SiH$_4$/H$_4$ | Pressure (Torr) |
|---|---|---|---|---|---|---|---|
| Photovoltaic layer | 1st doped layer | a-Si:H:P | 380 | 0.04 | 13.56 | 0.08 | 1.0 |
| | 1st i-layer | $\mu$ c-Si:H | 400 | 0.70 | 500 | 0.04 | 0.01 |
| | 2nd doped layer | $\mu$ c-Si:H:B | 200 | 0.006 | 13.56 | 0.02 | 1.5 |
| | 3rd doped layer | a-Si:H:P | 220 | 0.01 | 13.56 | 0.08 | 1.0 |
| | 2nd i-layer | a-Si:H | 200 | 0.16 | 13.56 | 0.05 | 1.2 |
| | 4th doped layer | $\mu$ c-Si:H:B | 160 | 0.005 | 13.56 | 0.02 | 1.5 |

| Layer | Material | Temperature (° C.) | Thick (μm) | Gas | Method |
|---|---|---|---|---|---|
| Upper electrode | ITO | 160 | 0.08 | Ar + O$_2$ | SP method |

SP method: sputtering

The cross-section of this solar cell was observed by TEM, which indicated that the first i-layer was made in the microcrystalline structure as shown in FIG. 1B. The surface roughness Ra of the lower conductive layer (the transparent, conductive layer/the reflecting layer) was measured, which showed that the average per 50 μm length was 0.29 μm. The percentage of angles G (each of which is an angle between the normal line to a fine area of the lower conductive layer and the normal line to the principal plane of the substrate) in the range of 15° to 45° both inclusive was calculated. It was 93%. The percentage K of the overall volume of prismatic crystalline grains with the angle F being 20° or less to the overall volume of the first i-layer was 94%.

Comparative Example 2

Several photoelectric conversion elements (Comp. Ex. 2) were fabricated by stacking the third doped layer, the second i-layer, and the fourth doped layer as in Example 2 between the second doped layer and the upper transparent electrode in the solar cell of Comparative Example 1 (Table 1B) having the structure as shown in FIG. 2. The cross-section of this solar cell was observed by TEM, which indicated that the first i-layer was made in the microcrystalline structure as shown in FIG. 2. The same measurements and tests as in Example 1 were conducted, which confirmed that the solar cells of Ex. 2 were better than those of Comp. Ex. 2.

Example 3

A long sheet was used as the substrate, and the reflecting layer and the transparent, conductive layer were successively formed thereon by the roll-to-roll method with high productivity. Further, the roll-to-roll method was also employed for forming the photovoltaic layer and the upper transparent electrode. The details thereof will be described.

Apparatus 1000 of FIG. 10 is a thin film forming apparatus that can make some thin films on the surface of long sheet substrate 1001 with flexibility in a vacuum. Reference numeral 1001 designates the long substrate with flexibility, such as stainless steel, 1008 a delivery roll around which the substrate is wound in a roll form, 1009 a winding roll for winding the substrate thereon, and 1002 a vacuum vessel in which the delivery roll can be fixed. A vacuum pump 1016 such as a rotary pump is connected to the vacuum vessel through a pipe 1018. Similarly, the winding roll 1009 is fixed in vacuum vessel 1007, and a vacuum pump is connected thereto.

Connected between the vacuum vessels 1002 and 1007 as shown in FIG. 10 are a path of the substrate, called gas gates 1021, and vacuum vessels 1003, 1004, 1005, 1006 for forming the desired thin films by DC magnetron sputtering. Gas inlet pipe 1010 is connected to each gas gate 1021 as illustrated to allow scavenging gas 1011 of Ar or the like to flow into the gas gate, whereby mutual diffusion of gas can be prevented from occurring between the vacuum vessels for forming different thin films. As a result, a good junction can be formed. The gas gates are connected between the vacuum vessels, but the gas gate does not have to be provided between the vacuum vessels if identical thin films are made in consecutive vacuum vessels.

Diffusion pump 1017 is connected through pipe 1019 to each vacuum vessel 1003, 1004, 1005, 1006, and a vacuum pump such as a rotary pump is further connected through a pipe thereto. Further provided inside each vacuum vessel 1003, 1004, 1005, 1006 are heater 1014 for heating the substrate, target 1023 for forming a desired thin film, electrode 1013 having a built-in magnet, and gas inlet pipe 1020 for introducing gas 1022 for sputtering. DC power supply 1012 is connected to each electrode.

A method for using this apparatus will be described. First, the delivery roll 1008 on which the long substrate with flexibility such as stainless steel is rolled is fixed in the vacuum vessel 1002, and the leading end of the substrate is guided through the gas gates and vacuum vessels 1003, 1004, 1005, 1006 into the vacuum vessel 1007 and is wound around the winding roll 1009 fixed inside the vacuum vessel 1007.

Each vacuum pump is actuated to evacuate the inside of each vacuum vessel before the internal pressure of each vacuum vessel becomes several mTorr. Ar gas is introduced through each gas inlet pipe 1010 and desired gas through 1020, the power supply of each heater is turned on, and the substrate is conveyed in the direction of arrow 1024. When the temperature of the substrate becomes constant, each DC power supply is turned on to induce plasma 1015 in each vacuum vessel 1003, 1004, 1005, 1006, thereby forming the desired thin films.

The conveyance is stopped with arrival of the trailing end of the substrate, each DC power supply and each heater power supply are turned off, and the substrate is cooled. When the temperature of the substrate becomes nearly equal to room temperature, each vacuum vessel is made to leak and then the winding roll is taken out.

The reflecting layer and the transparent, conductive layer were continuously made using the stainless steel substrate (SUS 430) 0.15 mm thick by the above method and under the conditions shown in Table 3. The cross-sectional shape of this lower conductive layer (the transparent, conductive layer/the reflecting layer) was observed by SEM, which indicated that the layer had the shape as shown in FIG. 1A or 1B. The average surface roughness Ra per 50 µm length was 0.35 µm. The percentage of angles G in the range of 15° to 45° both inclusive, calculated, was 90%.

Figure 11A:
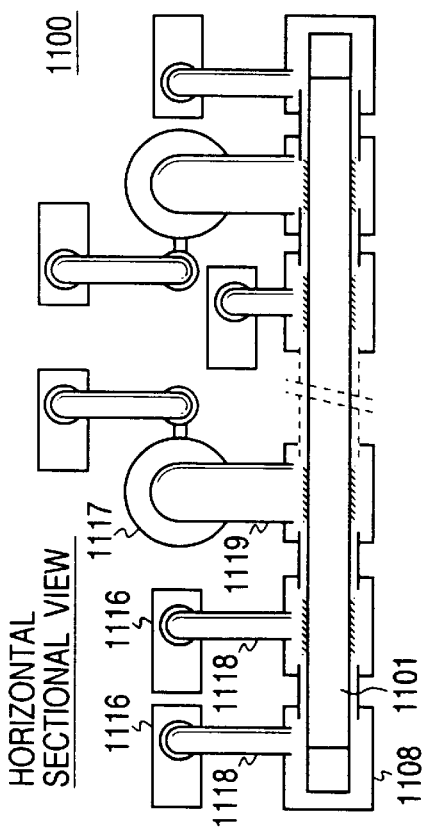
FIG. 11 is a drawing to show an apparatus for continuously forming the photovoltaic layer of the photoelectric conversion element of the present invention.
Figure 11B:
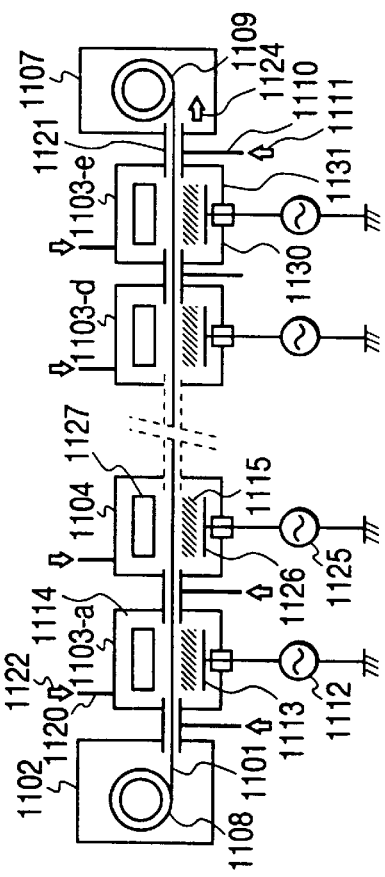
Figure 11C:
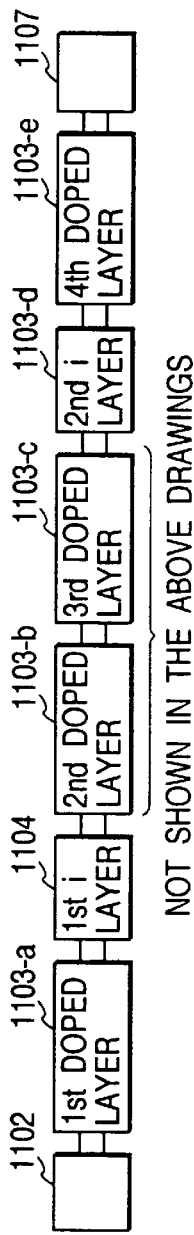

Next described in detail is an apparatus for forming the photovoltaic layer on the transparent, conductive layer by the roll-to-roll method. The apparatus of FIG. 11 is an apparatus for continuously making the photovoltaic layer comprised of six layers on the long substrate, and some of the vacuum vessels are not illustrated in the drawing. Reference numeral 1101 designates the long substrate on which the lower conductive layer was formed, 1108 a delivery roll around which the substrate is wound in a roll form, 1109 a winding roll for winding the substrate, and 1102 a vacuum vessel in which the delivery roll can be fixed. A vacuum pump 1116 such as the rotary pump is connected thereto through pipe 1118. Similarly, the winding roll 1109 is fixed in the vacuum vessel 1107, and a vacuum pump is connected thereto. Vacuum vessels 1103-a, 1104, 1103-b (not illustrated), 1103-c (not illustrated), 1103-d, 1103-e for forming the desired thin films are placed in order between vacuum vessels 1102 and 1107, and gas gates 1121 are connected between the vacuum vessels. Gas inlet pipe 1110 is connected to each gas gate 1121 as illustrated to allow the scavenging gas 1111 of Ar, $H_2$, He, or the like to flow into each gas gate, whereby mutual diffusion of gas can be prevented from occurring between the vacuum vessels for forming different thin films. As a result, the pin junction obtained is very good. The gas gate does not always have to be provided between the vacuum vessels if identical thin films are formed in consecutive vacuum vessels.

The RF plasma enhanced CVD (power frequency 13.56 MHz) can be carried out in vacuum vessels 1103-a, 1103-b, 1103-c, 1103-d, 1103-e. The rotary pump and gas inlet pipe 1120 are connected through pipe 1118 to each of the vacuum vessels, and heater 1114 and RF electrode 1113 are fixed inside each vacuum vessel. RF power supply 1112 is connected to the RF electrode. The high-frequency plasma enhanced CVD (power frequency 150 MHz) can be carried out in the vacuum vessel 1104. Diffusion pump 1117 is connected through pipe 1119 to the vacuum vessel, and the vacuum pump such as the rotary pump is further connected through a pipe thereto. Further, the gas inlet pipe is connected to the vacuum vessel, and the heater 1117 and high-frequency electrode 1126 are fixed inside. High-frequency power supply 1125 (frequency 150 MHz) is connected to the high-frequency electrode.

A method of use of this apparatus will be described. First, the delivery roll 1108 on which the above stainless steel substrate with the lower conductive layer is rolled is fixed in the vacuum vessel 1102 and the leading end of substrate is guided through each gas gate and each vacuum vessel to the inside of vacuum vessel 1107 and is wound around the winding roll 1109 fixed inside the vacuum vessel 1107. Then each vacuum pump is actuated to evacuate the inside of each vacuum vessel before the internal pressure of each vacuum vessel becomes several mTorr. $H_2$ gas is introduced through the gas inlet pipe 1110 and gases for forming the photovoltaic layer through the gas inlet pipes 1120, each heater power supply is turned on, and the substrate is conveyed in the direction of arrow 1124. When the temperature of the substrate becomes constant, each RF power supply and the high-frequency power supply are turned on and matching is adjusted to induce the plasma 1115 inside each vacuum vessel, thereby forming the desired thin films. The conveyance is stopped with arrival of the trailing end of the substrate, each RF power supply, each high frequency power supply, and each heater power supply are turned off, and the substrate is cooled. When the temperature of the substrate becomes nearly equal to room temperature, each vacuum vessel is made to leak and the winding roll is taken out. The first doped layer of a-Si:H:P/the first i-layer of μ cSi:H/the second doped layer of μ c-Si:H:B/the third doped layer of a-Si:H:P/the second i-layer of a-Si:H/the fourth doped layer of μ c-Si:H:B were made by the above-described method and under the conditions shown in Table 3.

The upper transparent electrode (ITO) was made continuously on the rolled solar cell thus taken out, using the apparatus of FIG. 10. On that occasion, the upper transparent electrode of ITO was made on the fourth doped layer in such a manner that the target inside the vacuum vessel 1006 was ITO and that only vacuum vessel 1006 was used without inducing the plasma in the vacuum vessels 1003, 1004, 1005. The conditions for making each layer are shown in Table 3.

Example 4

The solar cell (Ex. 4) was made in the same manner as in Example 1, except that the thickness of the first i-layer in Example 1 was changed to 2 μm. When the cross-section was observed by TEM, the structure of the first i-layer was found to be as shown in FIG. 1A or 1B. The same measurements and tests as in Example 1 were conducted, which showed that the solar cell of Ex. 4 was as good as the solar cell of Ex. 1.

Example 5

The solar cell in which the lower conductive layer was a single layer was made as another example. The lower conductive layer was a layer of silver 0.5 μm thick and was made by sputtering. The surface of the layer was roughened (or textured) by keeping the temperature of formation at 350° C. The cross-section was observed to count the percentage of angles G (each of which is an angle between the normal line to the fine area of the lower conductive layer and

TABLE 3

| Vacuum vessel | Target | Layer | | Material | Temperature (° C.) | Thick (μm) | Gas for sputtering | Method |
|---|---|---|---|---|---|---|---|---|
| 1003 | Al | Lower | reflecting layer | Al | 30 | 0.15 | Ar | SP method |
| 1004 | ZnO | conductive | transparent | ZnO | 200 | 0.20 | Ar + O$_2$ | SP method |
| 1005 | ZnO | layer | conductive layer | ZnO | 250 | 0.50 | Ar | SP method |
| 1006 | ZnO | | | ZnO | 250 | 0.50 | Ar | SP method |

| Vacuum vessel | Layer | Material | Temperature (° C.) | Thick (μm) | Power frequency (MHz) | SiH$_4$/H$_2$ | Pressure (Torr) |
|---|---|---|---|---|---|---|---|
| 1103-a | 1st doped layer | a-Si:H:P | 300 | 0.03 | 13.56 | 0.05 | 1.2 |
| 1104 | 1st i-layer | μc-Si:H | 380 | 0.85 | 150 | 0.03 | 0.03 |
| 1103-b | 2nd doped layer | μc-Si:H:B | 200 | 0.006 | 13.56 | 0.02 | 0.5 |
| 1103-c | 3rd doped layer | a-Si:H:P | 200 | 0.02 | 13.56 | 0.05 | 1.2 |
| 1103-d | 2nd i-layer | a-Si:H | 200 | 0.18 | 13.56 | 0.06 | 1.0 |
| 1103-e | 4th doped layer | μc-Si:H:B | 160 | 0.005 | 13.56 | 0.02 | 0.5 |

| Vacuum vessel | Target | Layer | Material | Temperature (° C.) | Thick (μm) | Gas for sputtering | Method |
|---|---|---|---|---|---|---|---|
| 1006 | ITO | upper transparent electrode | ITO | 160 | 0.08 | Ar + O$_2$ | SP method |

The rolled solar cell taken out was cut in the size of 30×30 cm$^2$, then the collector electrode and bus-bar as in Example 1 were attached as shown in FIG. 1A, four solar cells are connected in series as shown in FIG. 4, and a bypass diode is connected in parallel with each solar cell. Then stacked on a support substrate 0.3 mm thick were EVA, polyamide resin, EVA, nonwoven glass fabric, the solar cells connected in series, nonwoven glass fabric, EVA, nonwoven glass fabric, EVA, nonwoven glass fabric, and fluororesin, and the stack was subjected to heating-vacuum sealing (lamination).

The same measurements and tests as in Example 1 were conducted for the solar battery module (Ex. 3) fabricated as described above in the size of 35×130 cm. In either one of the initial characteristics, the torsion test, and the hailstorm test, the solar cell module Ex. 3 was better than the solar cell of Ex. 1. The outdoor exposure test was conducted while the solar cell module of Ex. 3 was placed outdoors for three months. Little change was observed in its appearance, and a drop of photoelectric conversion efficiency was about 5%.

It was confirmed that the photovoltaic module of the present invention had excellent characteristics.

the normal line to the principal plane of the substrate) in the range of 15° to 45° both inclusive, and the percentage was 91%. Several solar cells Ex. 5 of FIG. 1A were made by forming the same photovoltaic layer, the upper transparent electrode, and the collector electrode as in Example 1, on the lower conductive layer. The same measurements and tests as in Example 1 were conducted, which showed that the solar cells of Ex. 5 were as good as the solar cell of Ex. 1.

Example 6

The solar cell of FIG. 1B with the photovoltaic layer of FIG. 5 in which the first doped layer was of the stacked structure of a-Si:H:P/μ c-Si:H:P was made as another example. The solar cell (Ex. 6) was made in the same manner as in Example 2, except that the first doped layer of Example 2 was changed to that of a-Si:H:P/μ c-Si:H:P. The same measurements and tests as in Example 1 were conducted, which showed that the solar cell of Ex. 6 was as excellent as the solar cell of Ex. 2.

What is claimed is:

1. A photoelectric conversion element comprising a substrate, a lower conductive layer, a first doped layer, an i-layer, a second doped layer, and an upper conductive layer, wherein a surface of said lower conductive layer has an uneven shape, said i-layer contains prismatic crystalline grains, longitudinal directions of the prismatic crystalline grains are inclined with respect to a direction of a normal line to said substrate, a percentage of an overall volume of the prismatic crystalline grains, each having a below-defined angle of 20° or less, is 70% or more with respect to an overall volume of the i-layer, and said angle is an angle made between a straight line A passing said prismatic crystalline grain and being parallel to a longitudinal direction thereof and a straight line B passing said prismatic crystalline grain out of straight lines taking shortest courses between interface 1 between the first doped layer and said i-layer and interface 2 between the second doped layer and the i-layer.

2. A photoelectric conversion element according to claim 1, wherein surface roughness Ra in a length of about several ten $\mu$m, of the lower conductive layer located between the substrate and the semiconductor layers is between 0.1 $\mu$m and 1 $\mu$m both inclusive.

3. A photoelectric conversion element according to claim 1, wherein regions in each of which a direction of a normal line to a surface of the lower conductive layer in a fine area of said lower conductive layer is between 15° and 45° both inclusive with respect to a normal line to the principal plane of the substrate are 80% or more of the all surface region.

4. A photoelectric conversion element according to claim 1, wherein longitudinal lengths of said prismatic crystalline grains are between 100 Å and 0.3 $\mu$m both inclusive.

5. A photoelectric conversion element according to claim 1, wherein a thickness of said i-layer is between 0.3 $\mu$m and 3 $\mu$m both inclusive.

6. A photoelectric conversion element according to claim 1, wherein fine areas made of an amorphous silicon based semiconductor material exist at a volume percentage of 50% or less with respect to the all region of the i-layer in said i-layer.

7. A photoelectric conversion element according to claim 1, wherein said i-layer is made by a plasma enhanced CVD process using an electromagnetic wave having a frequency of in the range of 30 MHz to 600 MHz both inclusive and under such conditions that pressure is between 1 mTorr and 1 Torr both inclusive, hydrogen gas and a gas containing silicon are used as source gases, and a percentage of the gas containing silicon to the hydrogen gas is between 0.5% and 30% both inclusive.

8. A photoelectric conversion element according to claim 1, comprising a third doped layer, a second i-layer, and a fourth doped layer between said second doped layer and said upper conductive layer, wherein said second i-layer has an amorphous silicon based semiconductor and wherein a thickness thereof is between 0.1 $\mu$m and 0.4 $\mu$m both inclusive.

9. A photoelectric conversion element according to claim 8, wherein at least one of the doped layers has a microcrystalline silicon based semiconductor material.

10. A photoelectric conversion element according to claim 8, wherein said first doped layer and/or the third doped layer is of a stack structure comprised of a layer of a microcrystalline silicon based semiconductor material and a layer of an amorphous silicon based semiconductor material and wherein said layer of the microcrystalline silicon based semiconductor material is in contact with said i-layer.

11. A photoelectric conversion element according to claim 1, wherein said substrate is a long substrate of a belt shape.

12. A photoelectric conversion element comprising a substrate, a lower conductive layer, a first doped layer, an i-layer, a second doped layer, and an upper conductive layer, wherein a surface of said lower conductive layer has an uneven shape, said i-layer contains prismatic crystalline grains, longitudinal directions of the prismatic crystalline grains are inclined with respect to a direction of a normal line to said substrate, and regions in each of which a direction of a normal line to a surface of the lower conductive layer in a fine area of said lower conductive layer is between 15° and 45° both inclusive with respect to a normal line to the principal plane of the substrate are 80% or more of all surface region.

* * * * *

UNITED STATES PATENT AND TRADEMARK OFFICE
CERTIFICATE OF CORRECTION

PATENT NO. : 6,177,711 B1
DATED : January 23, 2001
INVENTOR(S) : Toshimitsu Kariya It is certified that error appears in the above-identified patent and that said Letters Patent is hereby corrected as shown below:

Title page,
Item [57], ABSTRACT,
Line 23, "upon" should read -- mechanical strength --;
Line 24, "and" should read -- and upon --; and
Line 25, "further" (second occurrence) should be deleted.

Column 1,
Line 63, "ilayer" should read -- i-layer --.

Column 5,
Line 16, "wall." should read -- wall surface. --;
Line 34, "of" (second occurrence) should be deleted;
Line 43, "stacked" should read -- stacked type --; and
Line 53, "e.g." should read -- e.g., --.

Column 8,
Line 57, "one" should be deleted; and
Line 58, "107" should read -- 107, --.

Column 9,
Line 37, "sputtering" should read -- sputtering, --;
Line 38, "process," should be deleted; and
Line 42, "of" should read -- of a --.

Column 15,
Line 10, "substrate thereon," should read -- substrate, --.

UNITED STATES PATENT AND TRADEMARK OFFICE
CERTIFICATE OF CORRECTION

PATENT NO. : 6,177,711 B1
DATED : January 23, 2001
INVENTOR(S) : Toshimitsu Kariya It is certified that error appears in the above-identified patent and that said Letters Patent is hereby corrected as shown below:

<u>Column 18,</u>
Line 62, "excellent" should read -- good --.

Signed and Sealed this

Twenty-ninth Day of January, 2002

Attest:

JAMES E. ROGAN
*Attesting Officer*    *Director of the United States Patent and Trademark Office*